(12) United States Patent
Bao et al.

(10) Patent No.: US 10,553,498 B2
(45) Date of Patent: Feb. 4, 2020

(54) INTEGRATED CIRCUIT WITH REPLACEMENT GATE STACKS AND METHOD OF FORMING SAME

(71) Applicant: International Business Machines Corporation, Armonk, NY (US)

(72) Inventors: Ruqiang Bao, Niskayuna, NY (US); Siddarth A. Krishnan, Newark, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,822

(22) Filed: Dec. 1, 2017

(65) Prior Publication Data

US 2018/0102294 A1    Apr. 12, 2018

Related U.S. Application Data

(63) Continuation of application No. 14/883,220, filed on Oct. 14, 2015, now Pat. No. 9,922,884.

(51) Int. Cl.
*H01L 21/70* (2006.01)
*H01L 21/8238* (2006.01)
*H01L 27/092* (2006.01)

(52) U.S. Cl.
CPC ........... *H01L 21/823842* (2013.01); *H01L 21/823821* (2013.01); *H01L 27/0924* (2013.01)

(58) Field of Classification Search
CPC ........... H01L 21/823842; H01L 27/092; H01L 27/0924; H01L 21/823821; H01L 21/845
See application file for complete search history.

(56) References Cited

U.S. PATENT DOCUMENTS

| | | |
|---|---|---|
| 6,225,221 B1 | 5/2001 | Ho et al. |
| 9,922,884 B2 | 3/2018 | Bao et al. |
| 2004/0071879 A1 | 4/2004 | Callegari et al. |
| 2005/0023686 A1 | 2/2005 | Lin |
| 2011/0143529 A1 | 6/2011 | Lee et al. |
| 2013/0026578 A1 | 1/2013 | Tsau |
| 2016/0087040 A1 | 3/2016 | Mao |

OTHER PUBLICATIONS

Notice of Allowance for U.S. Appl. No. 15/828,302, dated May 7, 2018, 19 pages.

(Continued)

*Primary Examiner* — Syed I Gheyas
(74) *Attorney, Agent, or Firm* — Alvin Borromeo; Hoffman Warnick LLC

(57) ABSTRACT

A first aspect of the invention provides for a method including: forming an interfacial layer in a first opening in a pFET region and a second opening in an nFET region, each opening being in a dielectric layer in the pFET region and the nFET region; forming a high-k layer over the interfacial layer in each of the first and second openings; forming a wetting layer over the high-k layer in each of the first and second openings; forming a first metal layer in each of the first and second openings, the first metal layer including tungsten; and forming a first gate electrode layer over the first metal layer to substantially fill each of the first and second openings, thereby forming a first replacement gate stack over the pFET region and a second replacement gate stack over the nFET region.

20 Claims, 6 Drawing Sheets

(56) References Cited

OTHER PUBLICATIONS

Notice of Allowance for U.S. Appl. No. 14/883,220, dated Nov. 8, 2017, 22 pages.
Non Final Office Action dated Jul. 22, 2016 for U.S. Appl. No. 14/883,220, filed Oct. 14, 2014; pp. 36.
Ranade, Pushkar Sharad; Advanced Gate Materials and Processes for Sub-70 nm CMOS Technology; Dissertation Submitted for the degree of Doctor of Philosophy in Engineering-Materials Science and Engineering of the University of California, Berkeley; Copyright 2002; pp. 134.
Final Office Action dated Jan. 6, 2017 for U.S. Appl. No. 14/883,220, filed Oct. 14, 2014; pp. 33.
Non Final Office Action dated Jun. 13, 2017 for U.S. Appl. No. 14/833,220, filed Oct. 14, 2014; pp. 39.

INTEGRATED CIRCUIT WITH REPLACEMENT GATE STACKS AND METHOD OF FORMING SAME

BACKGROUND

Technical Field

The present invention relates to gate stacks, and more particularly, to replacement gate stacks for p-type field-effect transistors and n-type field effect transistors and methods of forming the same.

Related Art

During integrated circuit fabrication, transistors can be formed in a semiconductor substrate. Each transistor includes a gate through which a current can be passed between source and drain terminals of the transistor. One approach to forming gates includes replacement metal gate (RMG) processing. RMG processing includes generating a number of sacrificial or dummy gates over a structure, such as a fin for a fin field effect transistor (FINFET), so that other processing steps, such as adjacent contact creation, can be carried out without damaging the gate. Once the other processing is carried out, the dummy gates are replaced with a metal to create the final metal gate structure. One challenge associated with RMG processing is reducing gate resistance in a p-type field-effect transistor without affecting the gate resistance in an n-type field-effect transistor or work function metals used to form the gates.

Generally speaking, a gate stack may include a wetting layer over a layer having a high dielectric constant (high-k layer) and an interfacial layer. Additionally, a gate electrode may be formed over the wetting layer. Titanium chloride ($TiCl_4$) is used a precursor for low resistivity titanium nitride (TiN) wetting layers and tungsten (W) may be deposited thereover using a precursor of tungsten fluoride ($WF_6$). Chlorine (Cl) and fluorine (F) each have been used to improve negative bias temperature instability (NBTI) by passivating defects in the bandgap of the high-k dielectric layer caused by dangling bonds, or unsatisfied valences. NBTI is a reliability issue which results in an increase in the threshold voltage and a decrease in both the drain current and transconductance of the integrated circuit when the NBTI is poor. However, chlorine (Cl) and fluorine (F) are not compatible to simultaneously improve the NBTI. The deposition of fluorine (F) from the tungsten fluoride ($WF_6$) may penetrate through the titanium nitride (TiN) wetting layer to react with the high-k layer and the interfacial layer. However, this increases the thickness of the inversion layer, or the area under the gate, which in turn reduces capacitance. Therefore, a critical titanium nitride (TiN) wetting layer thickness is needed to prevent the increased thickness of the inversion layer. Conventionally, tungsten (W) deposition with tungsten fluoride ($WF_6$) as a precursor, a nucleation layer and/or a cool fill tungsten (W) deposition is needed before chemical vapor deposition (CVD) of tungsten (W). Such nucleation layer and cool fill may offer higher resistivity than chemical vapor deposition (CVD) of tungsten (W) because of impurities that may be introduced due to the additional precursor needed for the nucleation layer and small tungsten (W) grain size due to the low temperature needed for cool fill tungsten (W).

SUMMARY

A first aspect of the invention provides for a method of forming a replacement gate stack for a p-type field-effect transistor (pFET) and an n-type field-effect transistor (nFET). The method may include: forming an interfacial layer in a first opening in a pFET region and a second opening in an nFET region, each opening being in a dielectric layer in the pFET region and the nFET region; forming a high-k layer over the interfacial layer in each of the first and second openings; forming a wetting layer over the high-k layer in each of the first and second openings; forming a first metal layer in each of the first and second openings, the first metal layer including tungsten; and forming a first gate electrode layer over the first metal layer to substantially fill each of the first and second openings, thereby forming a first replacement gate stack over the pFET region and a second replacement gate stack over the nFET region.

A second aspect of the invention provides for an integrated circuit (IC) structure. The IC structure may include: a first replacement gate stack in a dielectric layer in a pFET region, the first replacement gate stack including: an interfacial layer in a first opening in the dielectric layer; a high-k layer over the interfacial layer in the first opening; a wetting layer over the high-k layer in the first opening; a first metal layer over the wetting layer in the first opening, the first metal layer including tungsten; and a first gate electrode layer over the first metal layer and substantially filling the first opening; and a second replacement gate stack in the dielectric layer in an nFET region, the second gate stack being laterally adjacent to the first gate stack and including: the interfacial layer in a second opening in the dielectric layer; the high-k layer over the interfacial layer in the second opening; a first gate electrode layer over the high-k layer and substantially filling the second opening.

BRIEF DESCRIPTION OF THE DRAWINGS

The embodiments of this invention will be described in detail, with reference to the following figures, wherein like designations denote like elements, and wherein.

DETAILED DESCRIPTION

Aspects of the present disclosure are directed to gate stacks, and more particularly, to replacement gate stacks for p-type field-effect transistors and n-type field effect transistors and methods of forming the same. Specifically, the gate stacks of the present disclosure includes using at least one of a chlorine (Cl)-doped tungsten and a pure tungsten (W) as precursor for a gate electrode. Therefore, the present invention does not include the use of fluorine (F) as a precursor for a gate electrode thereby improving the gate resistance, the negative bias temperature instability (NBTI), and the performance of the integrated circuit.

Aspects of the present invention are shown and described with respect to a fin-shaped field-effect transistor (FINFET).

However, it is to be understood that aspects of the present invention are equally applicable to other types of transistors, such as planar transistors.

Figure 1:
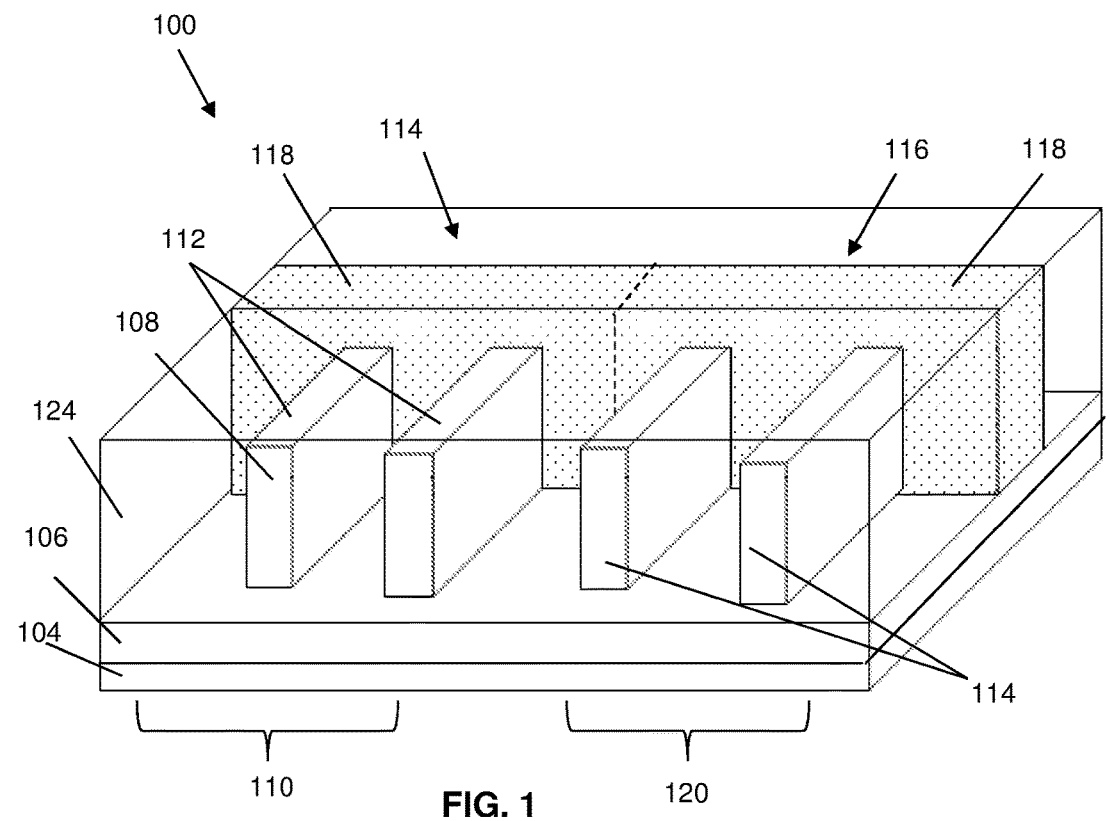
FIGS. 1-2 each show a three dimensional view of a fin-shaped field-effect transistor.

FIG. 1 shows an IC structure as a FINFET 100 that has undergone preliminary steps leading up to the methods according to embodiment of the invention. FINFET 100 may include an n-type field effect transistor (nFET) region 120 and a p-type field-effect transistor (pFET) region 110. PFET region 110 and nFET region 120 may be laterally adjacent to one another on a semiconductor layer 104. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present. Overlying semiconductor layer 104 may be a buried oxide (BOX) layer 106, and overlying BOX layer 106 may be a silicon-on-insulator (SOI) layer 108.

Semiconductor layer 104 or SOI layer 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Fins 112, 114 may be formed in both pFET region 110 and nFET region 120 from SOI layer 108 as known in the art, e.g., via conventional etching and masking techniques. Fins 112, 114 may include doped regions (not shown) that may constitute the other parts of a transistor.

As used herein "etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

After fins 112, 114 are formed, gates 114, 116, i.e. dummy gates, may be formed as known in the art. Additionally, an interlayer dielectric (ILD) layer 124 may be deposited over gates 114, 116. "Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. ILD layer 124 may include a flowable chemical vapor deposited (FCVD) oxide, e.g., silicon oxide ($SiO_2$). However, ILD layer 124 may include other materials such as but not limited to: silicon nitride ($Si_3N_4$), fluorinated SiO2 (FSG), hydrogenated silicon oxycarbide (SiCOH), porous SiCOH, borophospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 2:
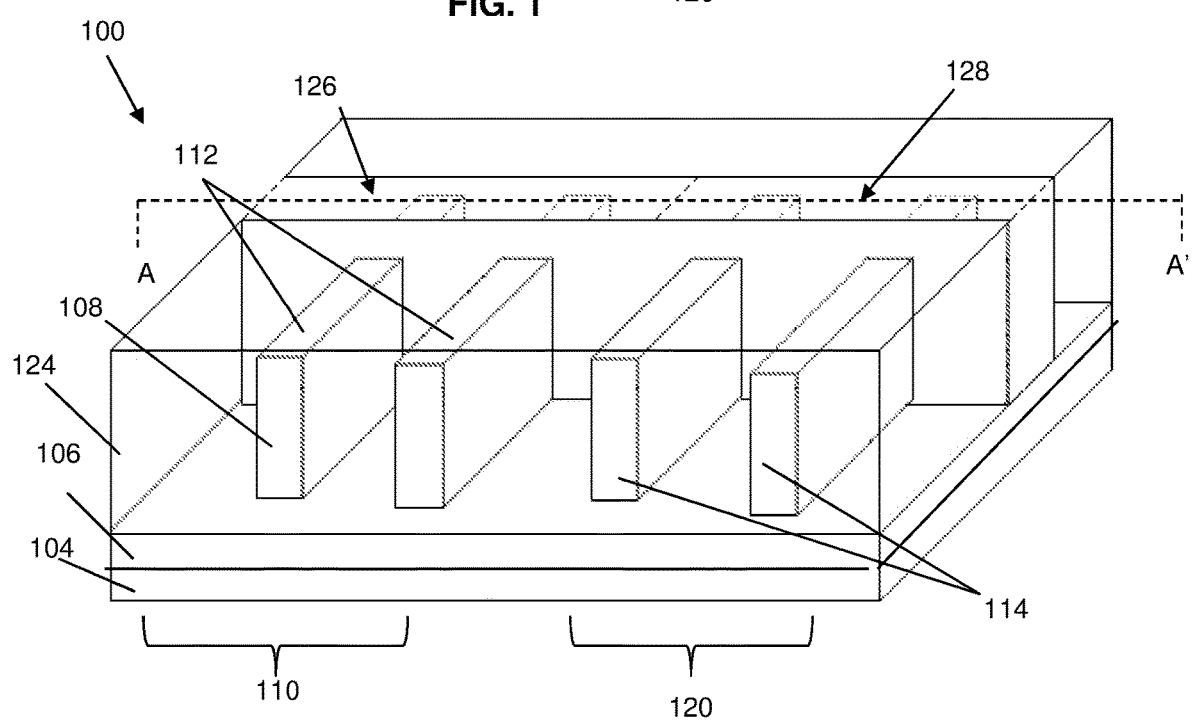

Gates 114, 116 in the form of dummy gates can allow other processing steps, e.g., adjacent contact creation, to be carried out without damaging an eventual metal gate that will replace the dummy gate. Referring to FIGS. 1-2 together, gates 114, 116 may be removed to create openings 126, 128 in ILD layer 124 in which replacement gate stacks may be formed as described herein. That is, sacrificial material 118 of gates 114, 116 may be removed, e.g., by an etch selective to sacrificial material 118, leaving openings 126, 128 such as by application of a wet etching material selective to metals. Opening 126 may be positioned over pFET region 110, and opening 128 may be positioned over nFET region 120.

Figure 3:
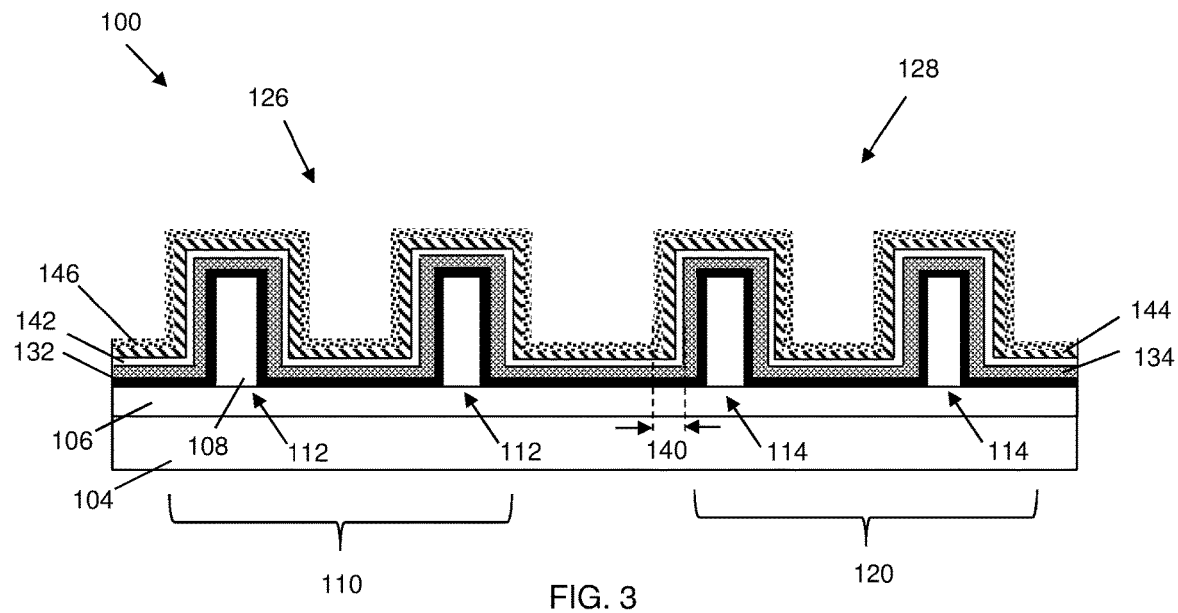
FIGS. 3-5 each show a cross-sectional view of a p-type fin-shaped field-effect transistor and an n-type fin-shaped field-effect transistor undergoing aspects of a method as described herein.

FIG. 3 shows a cross-section of FINFET 100 along line A-A' of FIG. 2. Referring now to FIG. 3, an interfacial layer 132 may be formed over FINFET 100 to substantially coat each fin 112, 114 within each opening 126, 128. That is, an interfacial layer 132 may be formed over IC structure 100, e.g. deposited or grown. As such herein, "substantially" refers to largely, for the most part, entirely specified or any slight deviation which provides the same technical benefits of the invention. Interfacial layer 132 may include, but is not limited to: silicon oxide ($SiO_2$) and silicon germanium oxide ($Si_xGe_yO_z$). Subsequently, a high-k layer 134 may be formed, e.g., deposited or grown, over interfacial layer 132. High-k layer 134 may include but is not limited to: hafnium oxide ($HfO_2$), or high dielectric constant (>3.9) materials. After forming interfacial layer 132 and high-k layer 134, a thermal treatment process, such as a laser anneal, may be performed to improve the quality of high-k layer 134 and interfacial layer 132.

Still referring to FIG. 3, an nFET work function metal layer 140 may be formed over high-k layer 134. NFET work function metal layer 140 can include a barrier layer 142, an nFET metal layer 144, and an nFET cap layer 146 therein. Barrier layer 142 may include but is not limited to: titanium nitride (TiN). Barrier layer 142 may be positioned over high-k layer 134. NFET metal layer 144 may include but is not limited to: titanium carbide (TiC). NFET metal layer 144 may be positioned over barrier layer 142, or to substantially coat barrier layer 142. NFET cap layer 146 may include but is not limited to: titanium nitride (TiN). NFET cap layer 146 may be positioned over nFET metal layer 144.

Figure 4:
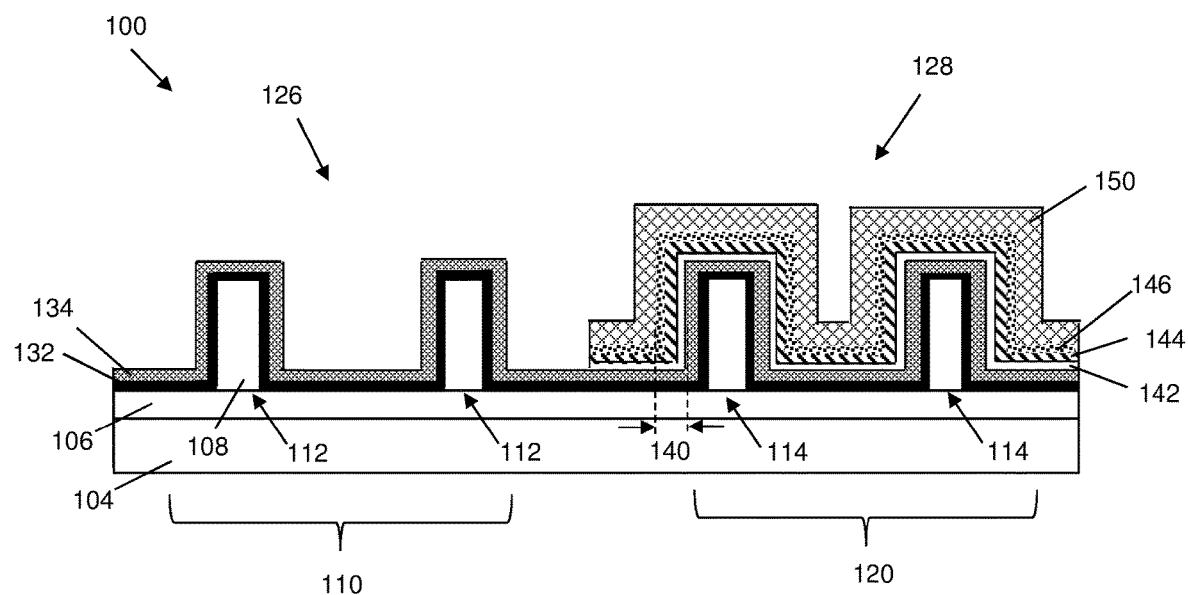

Turning to FIG. 4, a mask 150 may be formed over FINFET 100 and patterned to expose opening 126 over pFET 110. Subsequently, nFET work function metal layer 140 may be removed from opening 126 to expose high-k layer 134 thereunder. That is, each of barrier layer 142, nFET metal layer 144, and nFET cap layer 146 may be removed to expose high-k layer 134 in opening 126 over pFET region 110.

Figure 5:
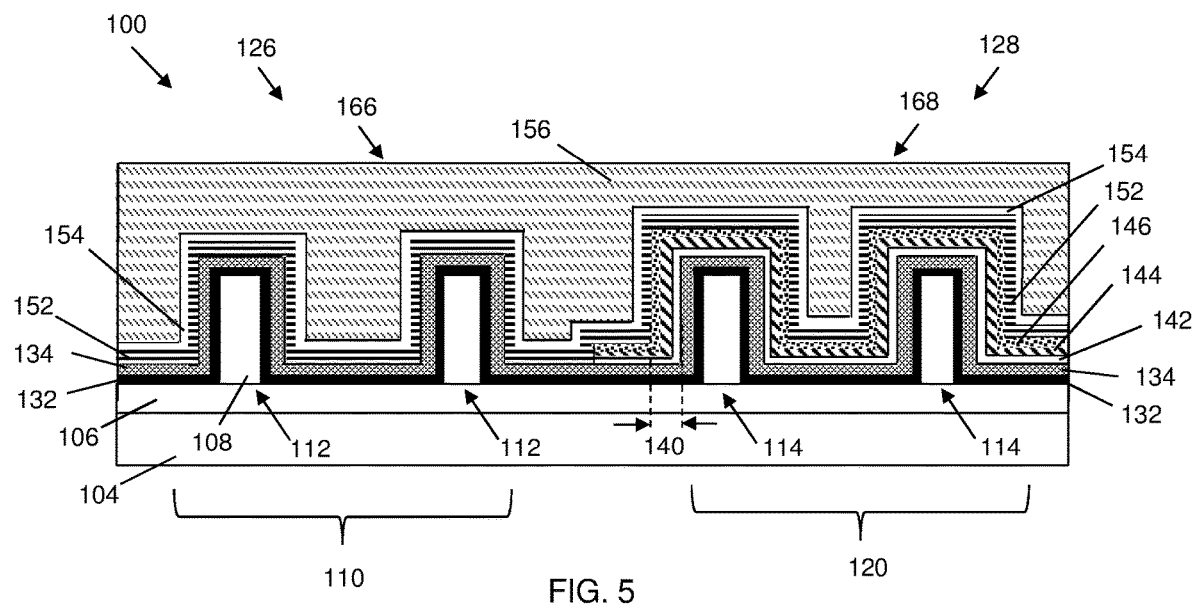

Referring to FIGS. 4-5 together, mask 150 may be removed and a wetting layer 152 may be formed over FINFET 100. In opening 126, wetting layer 152 may be formed over high-k layer 134. In opening 128, wetting layer 152 may be formed over nFET cap layer 146. Wetting layer 152 may include, but is not limited to: titanium nitride (TiN). Further, a metal layer 154 may be formed over wetting layer 152 in both openings 126, 128. Metal layer 154 may include chlorine(Cl)-doped tungsten (W) which can be processed by using chlorine (Cl) based precursor like tungsten chloride ($WCl_6$) via chemical vapor deposition (CVD), plasma-enhanced CVD (PECVD), physical vapor deposition (PVD), and/or atomic layer deposition (ALD). Alternatively, metal layer 154 may include a substantially pure tungsten (W), e.g., fluorine free tungsten (W) formed via atomic layer deposition (ALD). In one embodiment metal layer 154 may be formed by physical vapor deposition (PVD) of tungsten (W) followed by chlorine (Cl) doping via either chlorine (Cl) implantation or chlorine (Cl) plasma. In such case, wetting layer 152 is an optional. In another embodiment metal layer 154 may be formed by physical vapor deposition (PVD) of tungsten carbide (WC) or tungsten carbonitride (WCN) followed by chlorine (Cl) doping via either chlorine (Cl) implantation or chlorine (Cl) plasma. Where metal layer 154 includes chlorine (Cl)-doped tungsten, the chlorine (Cl) concentration in metal layer 154 could be from approximately 0.05 to approximately 5%. As used herein "approximately" is intended to include values, for example, within 10% of the stated values. The thickness of this chlorine(Cl)-doped tungsten (W) could be around 1 nanometer (nm) to 10 nanometers (nm).

Once metal layer 154 is formed, a gate electrode layer 156 may be formed over metal layer 154 to substantially fill each opening 126, 128. As such herein, "substantially" refers to largely, for the most part, entirely specified or any slight deviation which provides the same technical benefits of the invention. Gate electrode layer 156 may include bulk tungsten (W) which may include fluorine based W precursor ($WF_6$) without additional W nucleation layer by industry standard. In some embodiments, metal layer 154 and gate electrode layer 156 could be done in-situ to reduce oxidation to avoid resistance penalty. In some embodiments, gate electrode layer 156 may include fluorine (F) based tungsten (W) precursor ($WF_6$) with additional tungsten (W) nucleation layer and cool fill by industry standard. Anneal may be needed to drive chlorine (Cl) diffuse from tungsten (W) to high-k layer 134 to improve device performance. Additionally, a planarization technique may be performed to polish the materials within openings 126, 128 such that any material outside openings 126, 128 is removed.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Still referring to FIG. 5, the resulting gate stacks (hereinafter, "replacement gate stacks") 166, 168 in pFET region 110 and nFET region 120 are of distinct compositions. Replacement gate stack 166 in pFET region 110 includes interfacial layer 132 in opening 126 within ILD layer 124 (FIGS. 1-2), high-k layer 134 over interfacial layer 132, wetting layer 152 over high-k layer 134, metal layer 154 over wetting layer 152, and gate electrode layer 156 over metal layer 154 and substantially filling opening 126. Replacement gate stack 168 in nFET region 120 includes interfacial layer 132 in opening 128 within ILD layer 124 (FIGS. 1-2), high-k layer 134 over interfacial layer 132, nFET work function metal layer 140 over high-k layer 134, wetting layer 152 over nFET work function metal layer 140, metal layer 154 over wetting layer 152, and gate electrode layer 156 over metal layer 154 and substantially filling opening 128. That is, replacement gate stack 168 may have a distinct composition from that of replacement gate stack 166. As discussed herein, nFET work function metal layer 140 may include barrier layer 142, nFET metal layer 144, and nFET cap layer 146.

Figure 6:
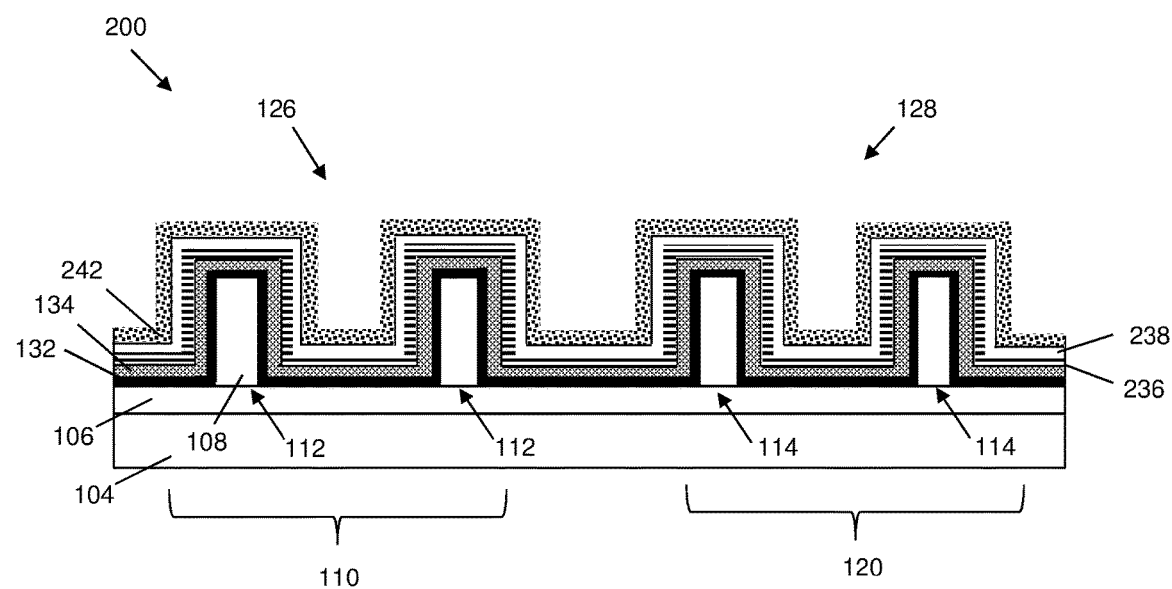
FIGS. 6-8 each show a cross-sectional view of a p-type fin-shaped field-effect transistor and an n-type fin-shaped field-effect transistor undergoing aspects of another method as described herein.
Figure 7:
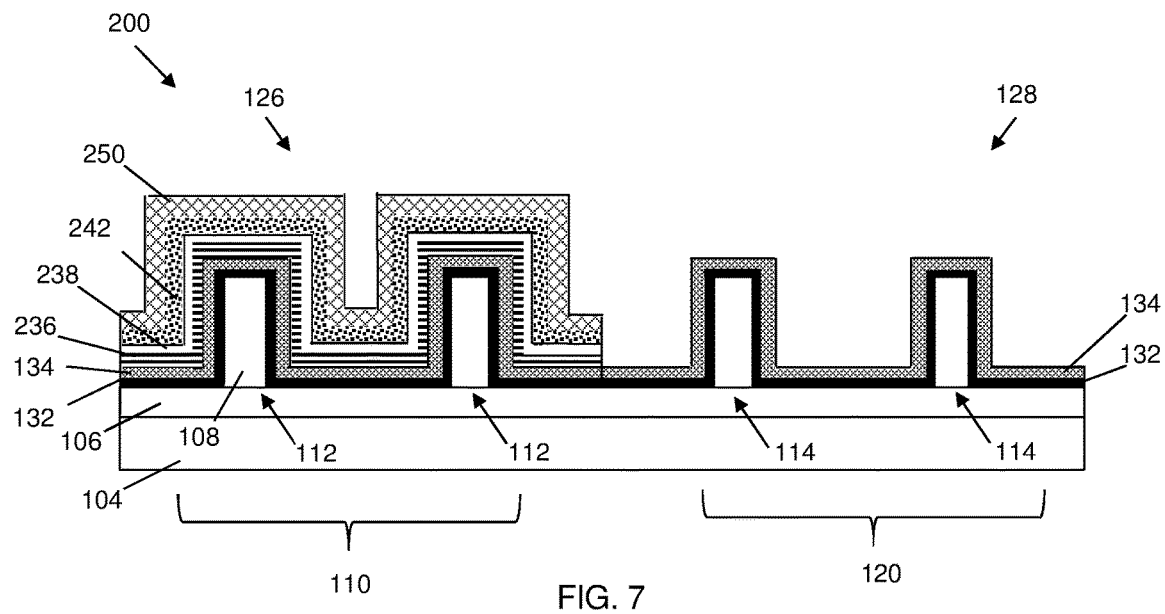
Figure 8:
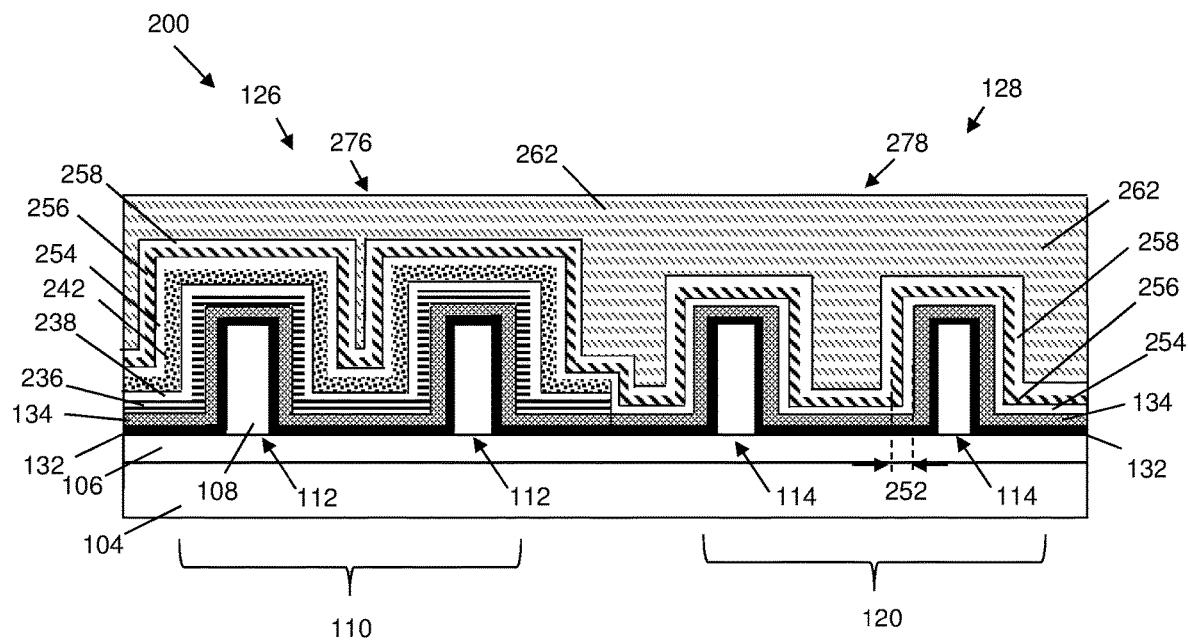

Turning to FIGS. 6-8, another embodiment of the invention is shown. FIG. 6 shows an IC structure as a FINFET 200 including interfacial layer 132 over fins 112, 114 and high-k layer 134 over interfacial layer 132 as described herein. Additionally, FINFET 200 may undergo a thermal treatment process as described herein. However, in this embodiment, a wetting layer 236 is formed over high-k layer 134. Wetting layer 236 may include any of the wetting layer materials discussed herein with respect to wetting layer 152. Additionally, a metal layer 238 may be formed over wetting layer 236. Metal layer 238 may include any of the metal layer materials discussed herein with respect to metal layer 154. Further, an optional cap layer 242 may be formed over metal layer 238. Optional cap layer 242 may include, but is not limited to: titanium nitride (TiN).

As shown in FIG. 7, a mask 250 may be formed over FINFET 200 and patterned to expose opening 128 in nFET region 120. In this embodiment, optional cap layer 242, metal layer 238, and wetting layer 236 may be removed from opening 128 to expose high-k layer 134 thereunder. Referring to FIGS. 7-8 together, mask 250 may be removed and an nFET work function metal layer 252 may be formed over FINFET 200. That is, nFET work function metal layer 252 may be formed over exposed high-k layer 134 in opening 128 in nFET region 128 and over optional cap layer 242 in opening 126 in pFET region 110. In an embodiment where optional cap layer 242 is not included, nFET work function metal layer 252 may be formed directly over high-k layer 134. NFET work function metal layer 252 may include a barrier layer 254 and an nFET metal layer 256. Therefore, more particularly, barrier layer 254 may be formed over the exposed high-k layer 134 in opening 128 in nFET region 120. In opening 126 in pFET region 110, barrier layer 254 may be formed over optional cap layer 242 (or alternatively, directly over metal layer 238 in an embodiment wherein optional cap layer 242 is not included) in opening 126 over pFET region 110. NFET metal layer 256 may be formed over barrier layer 254 in each opening 126, 128. Barrier layer 254 and nFET metal layer 256 may include any of the materials discussed herein with respect to barrier layer 142 and nFET metal layer 144, respectively. Additionally, another metal layer 258 may be formed over nFET metal layer 256. Metal layer 258 may include any of the materials discussed herein relative to metal layer 154. Further, a gate electrode layer 262 may be formed over metal layer 258 and substantially fill each opening 126, 128. Gate electrode layer 262 may include any of the gate electrode materials discussed herein relative to gate electrode layer 156. Subsequently, a planarization technique may be performed to remove any material outside openings 126, 128.

Referring solely to FIG. 8, the resulting replacement gate stacks 276, 278 in pFET region 110 and nFET region 120 are of distinct compositions. Replacement gate stack 276 in pFET region 110 includes interfacial layer 132 in opening 126 within ILD layer 124 (FIGS. 1-2), high-k layer 134 over interfacial layer 132, wetting layer 236 over high-k layer 134, metal layer 238 over wetting layer 236, optional cap layer 242 over metal layer 238, nFET work function metal layer 252 over metal layer 238, metal layer 258 over nFET work function metal layer 252, and gate electrode layer 262 over metal layer 258 and substantially filling opening 126. Replacement gate stack 278 in nFET region 120 includes interfacial layer 132 in opening 128 within ILD layer 124 (FIGS. 1-2), high-k layer 134 over interfacial layer 132, nFET work function metal layer 252 over high-k layer 134, metal layer 258 over nFET work function metal layer 252, and gate electrode layer 262 over metal layer 258 and substantially filling opening 128. That is, replacement gate stack 278 may have a distinct composition from that of replacement gate stack 276. As discussed herein, nFET work function metal layer 252 may include barrier layer 254 and nFET metal layer 256. Additionally, optional cap layer 238 may be removed in some embodiments.

Metal layers 238, 258 may include, or be composed of, the same or different materials. Metal layers 238, 252 could be any materials described with respect to metal layer 154. For example, in one embodiment, metal layers 238, 258 may each include a chlorine-doped (Cl) tungsten (W) layer. In another embodiment, metal layers 238, 258 may each include a substantially pure tungsten (W) layer. In yet another embodiment, metal layer 238 may include a chlorine-doped (Cl) tungsten (W) layer and metal layer 258 may include a substantially pure tungsten (W) layer. In another embodiment, gate electrode layer 262 may include a tungsten (W) nucleation layer followed by a pure tungsten (W) layer, a cool fill tungsten (W) film followed by pure tungsten (W) layer, or may include a tungsten (W) nucleation layer followed by a pure tungsten (W) layer.

Because replacement gate stacks 276, 278 use at least one of a chlorine (Cl)-doped tungsten and a pure tungsten (W) for metal layers 238, 262 as precursors for gate electrodes. Therefore, the present invention does not include the use of fluorine (F) as a precursor for a gate electrode thereby improving the negative bias temperature instability (NBTI) of the integrated circuit.

Figure 9:
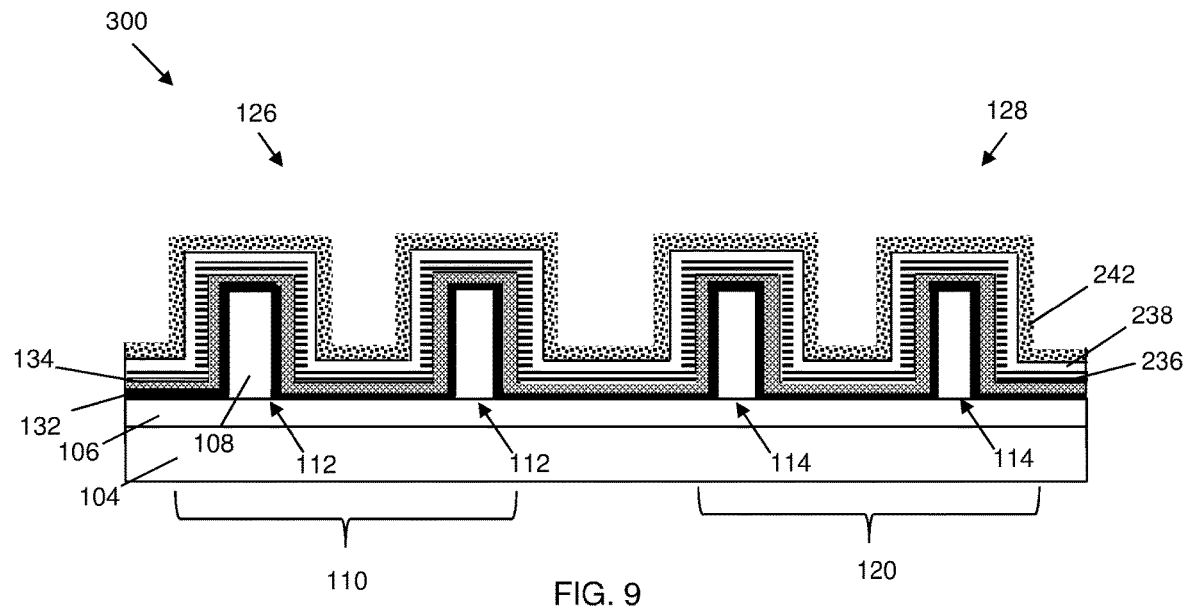
FIGS. 9-11 each show a cross-sectional view of a p-type fin-shaped field-effect transistor and an n-type fin-shaped field-effect transistor undergoing aspects of yet another method as described herein.
Figure 10:
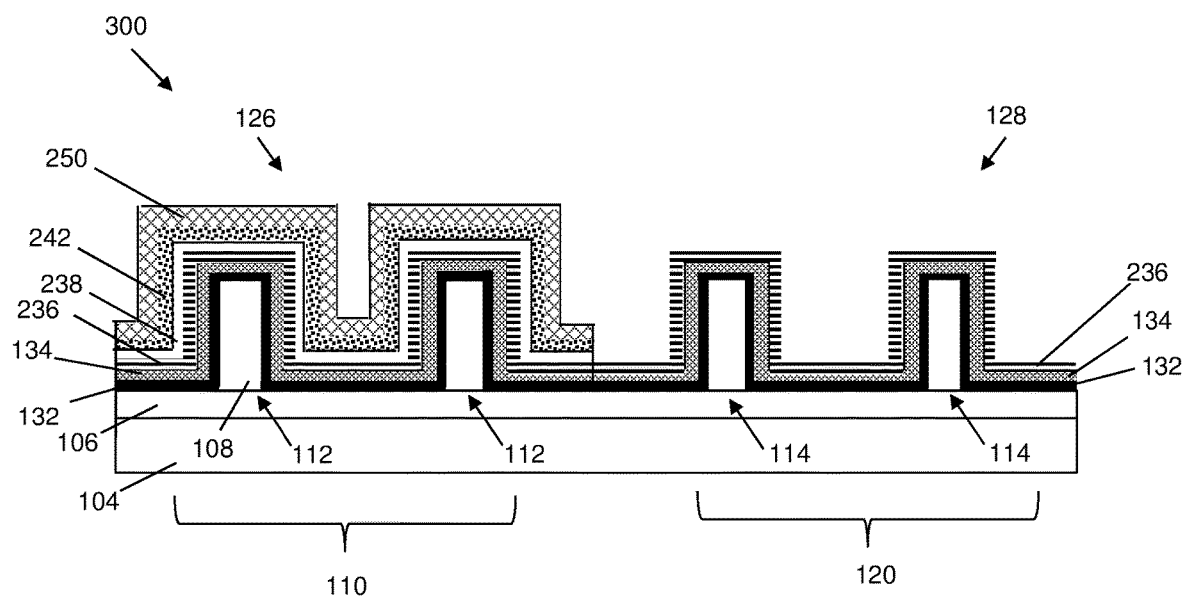
Figure 11:
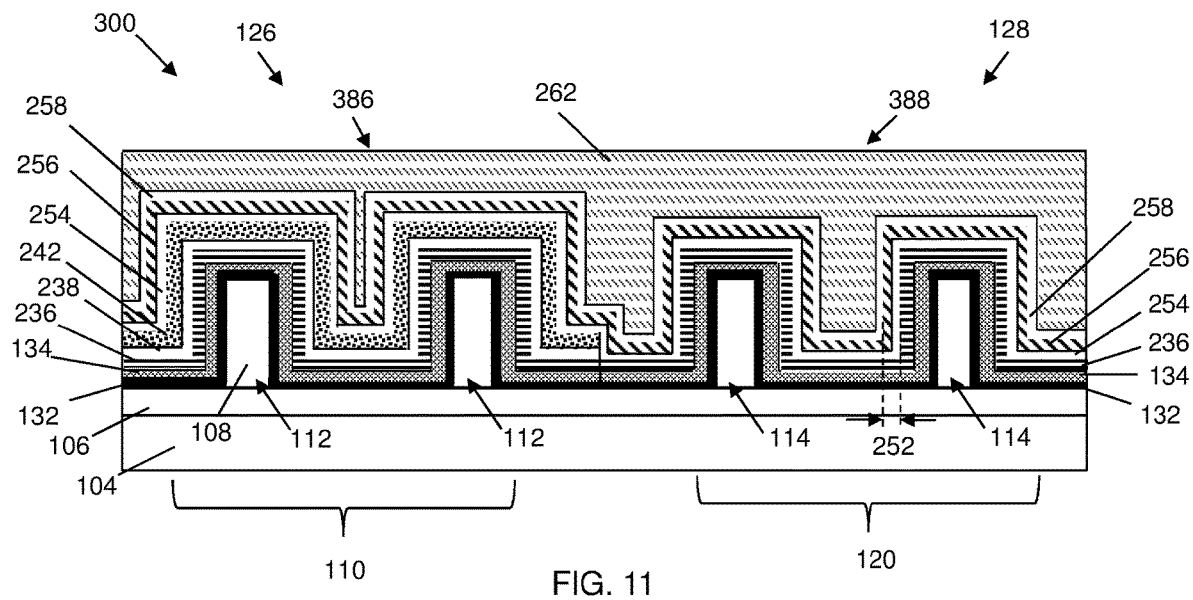

Turning to FIGS. 9-11, another embodiment of the invention is shown. FIG. 9 shows an IC structure as a FINFET device 300 including interfacial layer 132 over fins 112, 114 and high-k layer 134 over interfacial layer 132 as described herein. Additionally, FINFET 200 may undergo a thermal treatment process as described herein. However, in this embodiment, a wetting layer 236 is formed over high-k layer 134. Wetting layer 236 may include any of the wetting layer materials discussed herein with respect to wetting layer 152. Additionally, a metal layer 238 may be formed over wetting layer 236. Metal layer 238 may include any of the metal layer materials discussed herein with respect to metal layer 154. Further, an optional cap layer 242 may be formed over metal layer 238. Optional cap layer 242 may include any of the optional cap layer materials described herein.

As shown in FIG. 10, a mask 250 may be formed over FINFET 300 and patterned to expose opening 128 in nFET region 120. In this embodiment, optional cap layer 242 and metal layer 238 may be removed from opening 128 to expose wetting layer 236 thereunder. Referring to FIG. 11, mask 250 (shown in FIG. 10) may be removed and an nFET metal work function layer 252 may be formed over wetting layer 134 over in opening 128 in nFET region 120 and over optional cap layer 242 in opening 126 in pFET region 126. In an embodiment wherein optional cap layer 242 is not included, nFET metal work function layer 252 may be formed directly over metal layer 238. As described herein, nFET work function metal layer 252 may include a barrier layer 254 and an nFET metal layer 256. Therefore, more particularly, barrier layer 254 may be formed over exposed wetting layer 236 in opening 128 and over optional cap layer 242 (or metal layer 238 in an embodiment wherein optional cap layer 242 is not included) in opening 126. NFET metal layer 256 may be formed over barrier layer 254 in each opening. Barrier layer 254 and nFET metal layer 256 may include any of the materials discussed herein with respect to barrier layer 142 and nFET metal layer 144, respectively. Further, another metal layer 258 may be formed over nFET metal layer 256. Metal layer 258 may include any of the materials discussed herein relative to metal layer 154. Further, a gate electrode layer 262 may be formed over metal layer 258 and substantially fill each opening 126, 128. Gate electrode layer 262 may include any of the gate electrode materials discussed herein relative to gate electrode layer 156. Subsequently, a planarization technique may be performed to remove any material outside openings 126, 128.

Still referring to FIG. 11, the resulting replacement gate stacks 386, 388 in pFET region 110 and nFET region 120 can have distinct compositions. Replacement gate stack 386 in pFET region 110 includes interfacial layer 132 in opening 128 within ILD layer 124 (FIGS. 1-2), high-k layer 134 over interfacial layer 132, wetting layer 236 over high-k layer 134, metal layer 238 over wetting layer 236, optional cap layer 242 over metal layer 238, nFET work function metal layer 252 over metal layer 238, metal layer 258 over nFET work function metal layer 252, and gate electrode layer 262 over metal layer 258 and substantially filling opening 126. Replacement gate stack 278 in nFET region 120 includes interfacial layer 132 in opening 128 within ILD layer 124 (FIGS. 1-2), high-k layer 134 over interfacial layer 132, wetting layer 236 over high-k layer 134, nFET work function metal layer 252 over wetting layer 236, metal layer 258 over nFET work function metal layer 140, and gate electrode layer 262 over metal layer 258 and substantially filling opening 128. That is, replacement gate stack 388 may have a distinct composition from that of replacement gate stack 386. As discussed herein, nFET work function metal layer 252 may include barrier layer 254 and nFET metal layer 256. Additionally, optional cap layer 238 may be removed in some embodiments.

In this embodiment, metal layers 238, 258 may include the same or different materials. Metal layers 238, 252 could be any materials described with respect to metal layer 154. For example, in one embodiment, metal layers 238, 258 may each include a chlorine-doped (Cl) tungsten (W) layer. In another embodiment, metal layers 238, 258 may each include a substantially pure tungsten (W) layer. In yet another embodiment, metal layer 238 may include a chlorine-doped (Cl) tungsten (W) layer and metal layer 258 may include a substantially pure tungsten (W) layer. In another embodiment, gate electrode 262 may include a tungsten (W) nucleation layer followed by a pure tungsten (W) layer, a cool fill tungsten (W) film followed by pure tungsten (W) layer, or may include a tungsten (W) nucleation layer followed by a pure tungsten (W) layer.

Because replacement gate stacks 276, 278 use at least one of a chlorine (Cl)-doped tungsten and a pure tungsten (W) for metal layers 238, 262 as precursors for gate electrodes. Therefore, the present invention does not include the use of fluorine (F) as a precursor for a gate electrode thereby improving the negative bias temperature instability (NBTI) of the integrated circuit.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a replacement gate stack for a p-type field-effect transistor (pFET) and an n-type field-effect transistor (nFET), the method comprising:
    forming an interfacial layer in a first opening in a pFET region and a second opening in an nFET region, each opening being in a dielectric layer in the pFET region and the nFET region;
    forming a high-k layer over the interfacial layer in each of the first and second openings;
    forming a wetting layer over the high-k layer in each of the first and second openings;
    forming a first metal layer in the first opening, and directly over at least a portion of the wetting layer formed in the first opening, the first metal layer including a substantially pure tungsten precursor layer that is free of fluorine;
    forming a cap layer in the first opening, directly over the first metal layer formed in the first opening;
    forming a barrier layer directly over the cap layer formed in the first opening, and
    forming the barrier layer directly over the wetting layer formed in the second opening; and
    forming a first gate electrode layer over the barrier layer to substantially fill each of the first and second openings, the first gate electrode layer formed from a single material.

2. The method of claim 1, further comprising, prior to the forming of the wetting layer:
    forming a barrier layer over the high-k layer in each of the first and second openings;
    forming an nFET metal layer over the barrier layer in each of the first and second openings;
    forming an nFET cap layer over the nFET metal layer in each of the first and second openings; and
    removing the barrier layer, the nFET metal layer, and the nFET cap layer from the first opening to expose the high-k layer thereunder.

3. The method of claim 2, wherein the forming of the wetting layer includes forming the wetting layer over the high-k layer in the first opening and over the nFET cap layer in the second opening.

4. The method of claim 1, further comprising: prior to the forming of the first gate electrode layer,
    removing the first metal layer from the second opening; and
    removing the wetting layer from the second opening to expose the high-k layer thereunder.

5. The method of claim 4, further comprising after the removing of the wetting layer from the second opening:
    forming a barrier layer over the high-k layer in the second opening and over the first metal layer in the first opening;
    forming an nFET metal layer over the barrier layer in each of the first and second openings; and
    forming a second metal layer over the nFET metal layer in each of the first and second openings,
    wherein the first gate electrode layer is positioned over the second metal layer in each of the first and second openings.

6. The method of claim 5, wherein the forming the second metal layers includes forming a second chlorine-doped tungsten layer.

7. The method of claim 5, wherein the forming the second metal layers includes forming a second substantially pure tungsten layer.

8. The method of claim 1, further comprising: after the forming of the high-k layer, performing an anneal.

9. The method of claim 1, further comprising: prior to the forming of the first gate electrode layer,
    removing the first metal layer from the second opening to expose the wetting layer thereunder.

10. The method of claim 9, further comprising: after the removing of the first metal layer from the second opening, forming an nFET work function metal layer over the wetting layer in the second opening and forming the nFET work function metal layer over the first metal layer in the first opening; and
    forming a second metal layer over the nFET work function metal layer in each of the first and second openings.

11. The method of claim 10, wherein the forming the second metal layer includes forming a substantially pure tungsten layer.

12. The method of claim 1, wherein the single material forming the first gate electrode layer includes a tungsten-based material.

13. The method of claim 1, further comprising:
forming an nFET metal layer directly over the barrier layer; and
forming a distinct metal layer directly over the nFET metal layer,
wherein the first gate electrode layer is formed directly over the distinct metal layer.

14. An integrated circuit (IC) structure comprising:
a first replacement gate stack in a dielectric layer in a pFET region, the first replacement gate stack including:
an interfacial layer in a first opening in the dielectric layer;
a high-k layer formed directly over the interfacial layer in the first opening;
a wetting layer formed directly over the high-k layer in the first opening;
a first metal layer formed directly over the wetting layer in the first opening, the first metal layer including a substantially pure tungsten precursor layer that is free of fluorine;
a cap layer formed directly over the first metal layer in the first opening;
a barrier layer formed directly over the cap layer in the first opening; and
a first gate electrode layer formed over the barrier layer and substantially filling the first opening, the first gate electrode layer formed from a single material; and
a second replacement gate stack in the dielectric layer in an nFET region, the second gate stack being laterally adjacent to the first gate stack and including:
the interfacial layer in a second opening in the dielectric layer;
the high-k layer formed directly over the interfacial layer in the second opening;
the wetting layer formed directly over the high-k in the second opening;
the barrier layer formed directly over the wetting layer in the second opening; and
the first gate electrode layer formed over the barrier layer and substantially filling the second opening.

15. The IC structure of claim 14, wherein the second replacement gate stack further includes:
a barrier layer over the high-k layer in the second opening;
an nFET metal layer over the barrier layer in the second opening;
an nFET cap layer over the nFET metal layer in the second opening; and
the wetting layer over the nFET cap layer in the second opening.

16. The IC structure of claim 14, wherein the first replacement gate stack further includes:
a barrier layer over the first metal layer in the first opening;
an nFET metal layer over the barrier layer in the first opening; and
a second metal layer over the nFET metal layer in the first opening, wherein the first gate electrode layer is positioned over the second metal layer in the first opening.

17. The IC structure of claim 16, wherein the second replacement gate stack includes:
the barrier layer over the high-k layer in the second opening;
the nFET metal layer over the barrier layer in the second opening; and
the second metal layer over the nFET metal layer in the second opening;
wherein the first gate electrode layer is over the second metal layer in the second opening.

18. The IC structure of claim 14, wherein the first replacement gate stack further includes:
an nFET metal work function layer over the first metal layer in the first opening; and
a second metal layer over the nFET work function metal layer in the first opening,
wherein the first gate electrode layer is over the second metal layer in the first opening.

19. The IC structure of claim 18, wherein the second replacement gate stack further includes:
the wetting layer over the high-k layer in the second opening;
the nFET metal work function layer over the wetting layer in the second opening; and
the second metal layer over the nFET work function metal layer in the second opening,
wherein the first gate electrode is over the second metal layer in the second opening.

20. The IC structure of claim 18, wherein the second metal layer includes a substantially pure tungsten layer.

* * * * *